United States Patent
Lee et al.

(10) Patent No.: US 10,475,861 B2
(45) Date of Patent: Nov. 12, 2019

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventors: Jong-Kyun Lee, Goyang-si (KR);
Nack-Bong Choi, Gyeonggi-do (KR);
Myung-Woo Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/918,164

(22) Filed: Mar. 12, 2018

(65) Prior Publication Data

US 2018/0204886 A1 Jul. 19, 2018

Related U.S. Application Data

(63) Continuation of application No. 15/257,471, filed on Sep. 6, 2016, now Pat. No. 9,947,727.

(30) Foreign Application Priority Data

Sep. 7, 2015 (KR) .................. 10-2015-0126133

(51) Int. Cl.
| | |
|---|---|
| H01L 27/32 | (2006.01) |
| H01L 51/52 | (2006.01) |
| H01L 51/00 | (2006.01) |
| G06F 3/041 | (2006.01) |
| G06F 3/044 | (2006.01) |

(52) U.S. Cl.
CPC ............ *H01L 27/323* (2013.01); *G06F 3/044* (2013.01); *G06F 3/0412* (2013.01); *H01L 51/003* (2013.01); *H01L 51/5281* (2013.01); *G06F 2203/04102* (2013.01); *G06F 2203/04103* (2013.01); *G06F 2203/04111* (2013.01); *H01L 27/3272* (2013.01); *H01L 51/5246* (2013.01); *H01L 51/5253* (2013.01); *H01L 2227/323* (2013.01); *H01L 2227/326* (2013.01); *H01L 2251/5338* (2013.01)

(58) Field of Classification Search
CPC ..... G06F 3/0412; G06F 3/044; H01L 27/323; H01L 27/3248; H01L 27/3272; H01L 27/3276; H01L 51/003; H01L 51/5253; H01L 51/5281; H01L 51/56
See application file for complete search history.

(56) References Cited

U.S. PATENT DOCUMENTS

| | | | |
|---|---|---|---|
| 9,082,678 B2 | 7/2015 | Yamazaki et al. | |
| 2012/0086655 A1* | 4/2012 | Wang | G06F 3/044 345/173 |
| 2012/0113050 A1 | 5/2012 | Wang et al. | |

(Continued)

FOREIGN PATENT DOCUMENTS

| | | |
|---|---|---|
| CN | 102629169 A | 8/2012 |
| CN | 103839959 A | 6/2014 |

*Primary Examiner* — Allan R Wilson
(74) *Attorney, Agent, or Firm* — Dentons US LLP

(57) ABSTRACT

An organic light emitting display device realizes slimness, having flexibility, and effectively reducing or preventing visibility of reflected external light, which includes an organic light emitting panel, a first adhesive layer on the organic light emitting panel, a touch electrode array being in contact with the first adhesive layer, a separation layer on the touch electrode array, and a cover film on the separation layer.

41 Claims, 15 Drawing Sheets

(56) References Cited

U.S. PATENT DOCUMENTS

| | | |
|---|---|---|
| 2013/0335344 A1 | 12/2013 | Han et al. |
| 2014/0166998 A1 | 6/2014 | Lee et al. |
| 2015/0177889 A1 | 6/2015 | Lin et al. |
| 2015/0185942 A1* | 7/2015 | Kim ............... G06F 3/0412 345/173 |
| 2015/0370382 A1 | 12/2015 | Hsu et al. |
| 2016/0026315 A1 | 1/2016 | Choi et al. |
| 2016/0149164 A1* | 5/2016 | Lee ............... H01L 51/5281 257/40 |
| 2016/0306474 A1 | 10/2016 | Cho et al. |
| 2018/0061899 A1* | 3/2018 | Oh ............... G06F 3/0412 |

* cited by examiner

Active region | Peripheral region

ORGANIC LIGHT EMITTING DISPLAY DEVICE AND METHOD OF MANUFACTURING THE SAME

This application is a Continuation Application of U.S. patent application Ser. No. 15/257,471 filed on Sep. 6, 2016, which claims the benefit of Korean Patent Application No. 10-2015-0126133, filed on Sep. 7, 2015, which is hereby incorporated by reference as if fully set forth herein.

BACKGROUND OF THE INVENTION

Field of the Invention

The present invention relates to a display device, and more particularly, to an organic light emitting display device having slim profile and flexibility, and a method of manufacturing the same.

Discussion of the Related Art

Flat display devices include a liquid crystal display device (LCD), an organic light emitting diode (OLED) device, a plasma display panel (PDP) device, a quantum dot display device, a field emission display (FED) device, an electrophoretic display (EPD) device, etc. Each of these flat display devices typically includes a flat display panel for displaying an image in which a pair of transparent insulating substrates facing each other are bonded to each other, with an intrinsic light emitting layer, a polarizing layer or other optical material layers interposed therebetween.

As the demand for a flat display element having a small space occupation is increasing in accordance with the recent trend of large-sized display devices, an organic light emitting display device is considered as the next generation display device among these flat display devices. This is because the organic light emitting display device typically does not require a separate light source and a structure to assemble the light source to a display panel, and includes organic light emitting diodes spontaneously emitting light in the unit of pixels.

An organic light emitting diode typically comprises an anode, a cathode and an organic layer between the anode and the cathode. The organic light emitting diode emits light when pairs of electrons and holes, which are injected into the organic layer between an electron injection electrode (a cathode) and a hole injection electrode (an anode) and then are recombined in the organic layer, are transitioned from an excited state to a ground state.

Meanwhile, a touch panel, which can recognize a touch point contacted by a human hand or other input unit, is recently added and attached to an external surface of a display device.

Touch panels are divided into a resistive type, a capacitive type, and an infrared sensing type. Presently, the capacitive type touch panel is advantageous for small-sized display devices due to ease of fabrication and sensitivity.

Hereinafter, a conventional organic light emitting display device to which a touch panel is attached will be described with reference to the accompanying drawings.

FIG. 1 is a cross-sectional view illustrating a conventional organic light emitting display device to which a touch panel is attached.

As shown in FIG. 1, the conventional organic light emitting display device includes an organic light emitting display panel 10, a touch panel 20 and a cover film 30 which are sequentially stacked. First and second adhesive layers 15 and 25 are provided between the light emitting display panel 10 and the touch panel 20 and between the touch panel 20 and the cover film 30, respectively.

Herein, the organic light emitting display panel 10 includes a substrate, a thin film transistor array arranged on the substrate in a matrix, and organic light emitting diodes connected to respective thin film transistors of the thin film transistor array. An encapsulating substrate sealing the organic emitting diodes and a polarizing layer are further provided. In this case, the first adhesive layer 15 is disposed on the polarizing layer. The touch panel 20 includes a plurality of touch electrodes disposed on its touch substrate for detecting a user's touch.

The substrate of the organic light emitting display panel 10, the encapsulating substrate, the touch substrate of the touch panel 20 and the cover film 30 are typically formed of a hard material such as glass. These substrates typically have a thickness of about 0.5 mm or more, and thus, it may be difficult to manufacture an organic light emitting display device to which a touch panel is attached with slim profile and desired flexibility.

SUMMARY OF THE INVENTION

Accordingly, the present invention is directed to an organic light emitting display device and a method of manufacturing the same that substantially obviates one or more problems due to limitations and disadvantages of the related art.

An advantage of the present invention is to provide an organic light emitting display device having slimness and flexibility, and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device, in which a plastic or glass support substrate used to form a touch electrode array is removed after forming the touch electrode array, is provided. As a result, an entire thickness of the organic light emitting display device can be decreased when the touch electrode array is disposed on an organic light emitting panel. In addition, a material causing visibility of reflected external light can be removed, thereby improving visibility of desired images.

In an aspect of the present invention, an organic light emitting display device including an organic light emitting panel includes a thin film transistor array on a base substrate, an organic light emitting diode array electrically connected to the thin transistor array, and an encapsulation layer covering the organic light emitting diode array, a first adhesive layer on the organic light emitting panel, a touch electrode array being in contact with the first adhesive layer, a separation layer on the touch electrode array, and a cover film on the separation layer.

The separation layer may have a thickness of 100 Å or less.

The separation layer may include a silicon material or a metal oxide layer.

The organic light emitting display device may further include a barrier layer in contact with the touch electrode array and a buffer layer in contact with the buffer layer, between the touch electrode array and the separation layer.

The barrier layer may include an inorganic layer having a thickness of 500 Å to 3,000 Å, and the buffer layer may include an organic layer having a thickness of 1 μm to 8 μm.

The barrier layer may include a single layer of an oxide layer or a nitride layer, multi-layers of an oxide layer or a nitride layer, or an alternately laminated layer of an oxide layer and a nitride layer.

The buffer layer may include at least one of an acrylic group, an epoxy group, a polyimide group, and a polyamide group.

The cover film may include a circular polarizing plate.

The circular polarizing plate may be in contact with the separation layer.

The organic light emitting display device may further include a second adhesive layer between the separation layer and the cover film.

The separation layer and the cover film may be in contact with a lower surface and an upper surface of the second adhesive layer, respectively.

The organic light emitting display device may further include a circular polarizing plate between the second adhesive layer and the cover film.

The touch electrode array may include a plurality of first and second touch electrodes intersecting each other; a protective layer covering the first and second touch electrodes; a plurality of touch pad electrodes corresponding to the first and second electrodes at an outside region of an active region, and a plurality of routing wires transmitting signals to the first and second touch electrodes at the touch pad electrodes, wherein, at least one of the first and second touch electrodes, the routing wires, and the touch pad electrodes may be in contact with the barrier layer, and the protective layer may be in contact with the first adhesive layer.

The organic light emitting display device may further include a light shielding layer between the barrier layer and the protective layer within the touch electrode array, and the light shielding layer including a color filter layer and a black matrix layer staked.

In accordance with another aspect of the present invention, there is provided a method of manufacturing an organic light emitting display device including providing an organic light emitting panel comprising a thin transistor array on a first base substrate, an organic light emitting diode array electrically connected to the thin transistor array, and an encapsulation layer covering the organic light emitting diode array, forming a separation layer and a touch electrode array on a second base substrate, attaching a first adhesive layer between the encapsulation layer and the touch electrode array which face each other, exposing the separation layer to remove the second base substrate, and attaching a cover film to the exposed separation layer through a second adhesive layer.

Removing the second base substrate may include irradiating a laser.

Optionally, removing the separation layer to a certain thickness may be added.

The remaining separation layer may have a thickness of 100 Å, or less after partially removing the separation layer.

Also, forming a buffer layer and a barrier layer on the separation layer may be added, after forming the separation layer and before forming the touch electrode array.

The second base substrate may include a plastic substrate or a glass substrate, or a stacked structure of a plurality of plastic substrates.

In accordance with another aspect of the present invention, there is provided a method of manufacturing an organic light emitting display device including providing an organic light emitting panel including a thin transistor array on a base substrate, an organic light emitting diode array electrically connected to the thin transistor array, and an encapsulation layer covering the organic light emitting diode array, sequentially forming a separation layer, a buffer layer, a barrier layer and a touch electrode array on a glass substrate, attaching a first adhesive layer between the encapsulation layer and the touch electrode array, which face each other, removing the glass substrate and the separation layer, and attaching a cover film to the exposed buffer layer through a second adhesive layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. Names of components used in the following description may be selected in consideration of facility of specification preparation. Thus, the names of the components may be different from names of components used in a real product.

Figure 2:
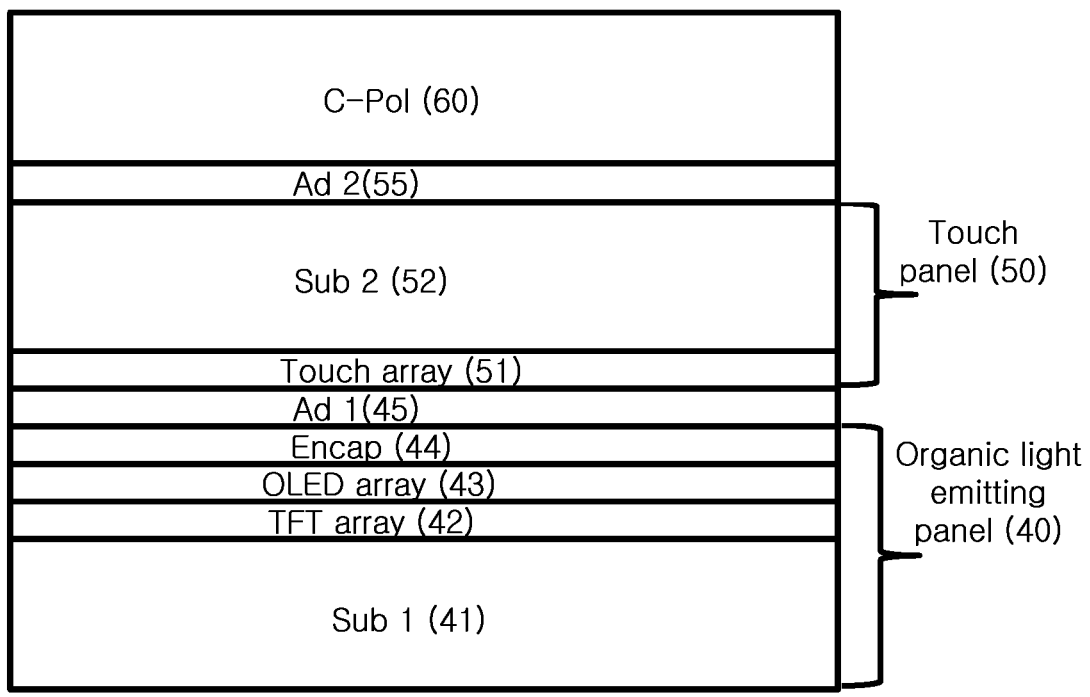
FIG. 2 is a cross-sectional view illustrating an example of an organic light emitting display device employed as a flexible display.
Figure 3:
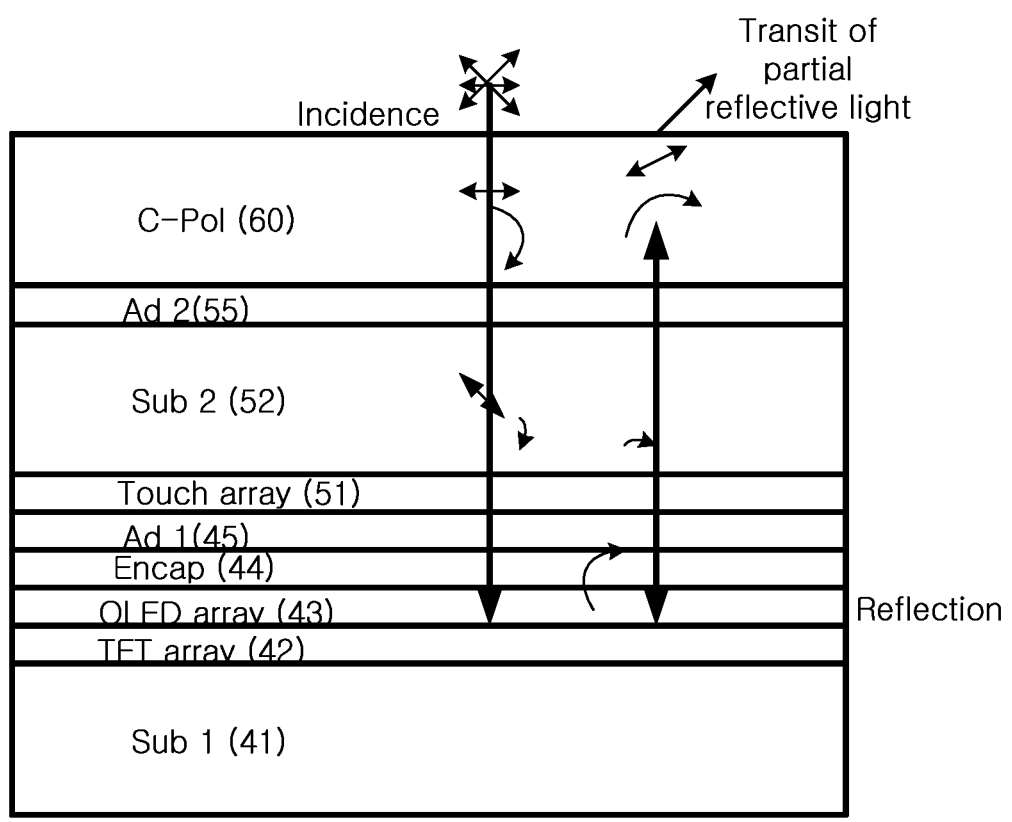
FIG. 3 is a view illustrating an optical path of an external light incident on the organic light emitting display device of FIG. 2.

FIG. 2 is a cross-sectional view illustrating an example of an organic light emitting display device as a flexible display. FIG. 3 is a view illustrating an optical path of an external light incident on the organic light emitting display device of FIG. 2.

Figure 1:
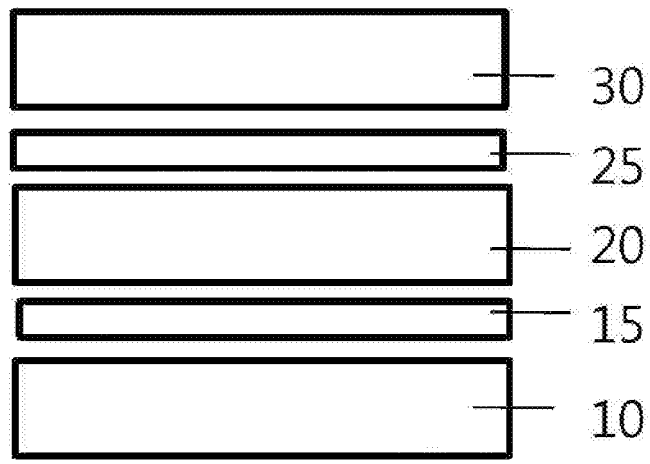
FIG. 1 is a cross-sectional view illustrating a conventional organic light emitting display device to which a touch panel is attached.

Referring to FIG. 2, an organic light emitting display device according to an embodiment includes first and second plastic base substrates 41 and 52, with which the substrate and the touch panel of the organic light emitting display including the attached touch panel of FIG.1 are replaced, and a circular polarizing plate 60, with which the cover film of FIG. 1 is replaced.

In this case, an organic light emitting display panel 40 disposed at a lower side includes the first plastic base substrate 41, a thin film transistor array 42, an organic light emitting array 43, and an encapsulating layer 44, which are sequentially stacked from below. A touch panel facing the organic light emitting display panel 40 includes the second plastic base substrate 52, a touch electrode array 51 disposed on the second plastic base substrate 52.

In addition, a first adhesive layer 45 is disposed between the organic light emitting display panel 40 and the touch panel 50. A second adhesive layer 55 is disposed between the touch panel 50 and the circular polarizing plate 60.

In this case, a polarizing plate is omitted in the organic light emitting display panel 40. The circular polarizing plate 60 is disposed at the outmost side to reduce or prevent a reflection of external light while protecting a surface of the device.

As compared to the organic light emitting display device according to the related art, the thick glass material is replaced with the plastic substrates 41 and 52 and the circular polarizing plate 60 having a thickness of 25 μm or lower, and, as such, the thickness of the entire device can be decreased and the flexibility of the device can be increased.

Meanwhile, when the thin film transistor array 42 and the touch electrode array 52 are formed on the thin first and second plastic substrates 41 and 52, the first and second plastic substrates 41 and 52 can be rolled. To this end, a support substrate such as a glass substrate is disposed on each of the lower sides of the first and second plastic substrates 41 and 52 to support the first and second plastic substrates 41 and 52. After completing an array process and an bonding process in which the organic light emitting light panel 40 is attached to the touch panel 50, the support substrates may be removed.

The organic light emitting display device of FIG. 2 has an advantage in flexibility, but may have a reflective element in response to an external light, which will now be described in detail.

Referring to FIG. 3, after an external light is incident on the circular polarizing plate 60 along a certain axis, the circularly polarized light then passes through the second adhesive layer 55, the touch panel 50, the first adhesive layer 45, and the organic light emitting display panel 40. Herein, an optical path of the circular polarized light changes due to a birefringence at the second plastic substrate 52 of the touch panel 50. In this case, after the circularly polarized light is reflected from a reflection electrode of the organic light emitting array 43 in the organic light emitting display panel 40, the reflected light reaches the circular polarizing plate 60 through the first adhesive layer 45, the touch panel 50, and the second adhesive layer 55. Herein, the reflected light includes an element crossing the certain axis of the circular polarizing plate 60 and an element twisted by the birefringence of the second plastic substrate 52, which may result in a light leakage.

Hereinafter, in consideration of the principle of FIG. 3, changes of birefringence of the second flexible substrate 52 will be measured and discussed depending on materials and thicknesses employed.

Figure 4:
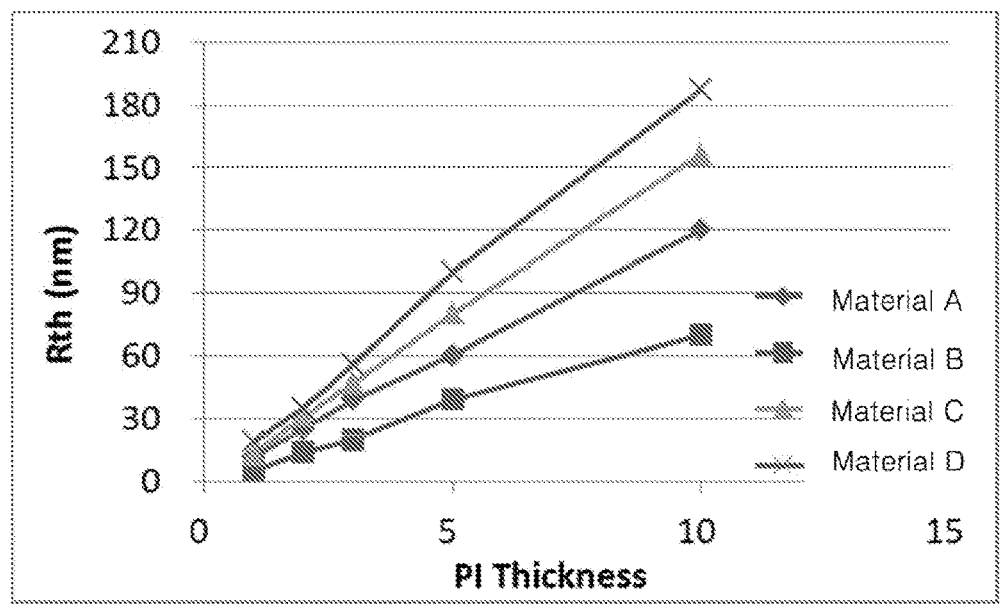
FIG. 4 is a graph showing changes of birefringence depending on types of materials and thicknesses of the second flexible substrate of FIG. 2.

FIG. 4 is a graph showing changes of birefringence depending on types of materials and thicknesses of the second flexible substrate 52 of FIG. 2.

The second plastic substrate 52, as tested in FIG. 4, is a transparent polyimide group film. The second plastic substrate 52 has materials A to D which are different from one another. However, FIG. 4 shows that regardless of the material A to D employed, as the thickness of the second plastic substrate 52 increases, the birefringence thereof increases. In addition, the visibility of the reflected light increases in proportion to an amount of birefringence of the second flexible substrate 52.

When the second plastic substrate 52 has a thickness of about 5 μm to 20 μm, an amount of birefringence Rth is greater than 40 nm for all the materials of the second plastic substrates 52, namely, A to D. In this case, although the circular polarizing plate 60 for birefringence is provided, it may not be easy to reduce or prevent reflection of external light due to the birefringence of the second plastic substrate 52, which is used for a slim profile design of the organic light emitting display device.

To reduce or prevent the visibility of the reflected light caused by the birefringence of the second plastic substrate 52, an optical compensation film such as a C+ plate may be further provided to compensate for the birefringence of the second plastic substrate 52. However, since the optical compensation film typically has a thickness 150 μm or more, there may be a disadvantage in flexibility.

Hereinafter, an organic light emitting display device according to an embodiment will be described, which does not include an optical compensation film for slimness and flexibility. However, the present invention is not limited thereto, and an organic light emitting display device according to an embodiment of the present invention may include an optical compensation film.

Figure 5:
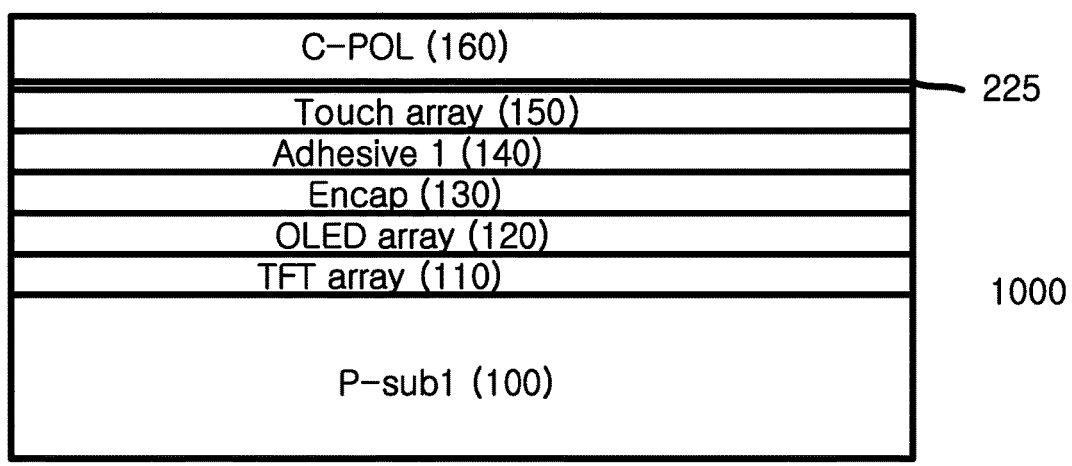
FIG. 5 is a cross-sectional view illustrating an organic light emitting display device according to an embodiment of the present invention.
Figure 6:
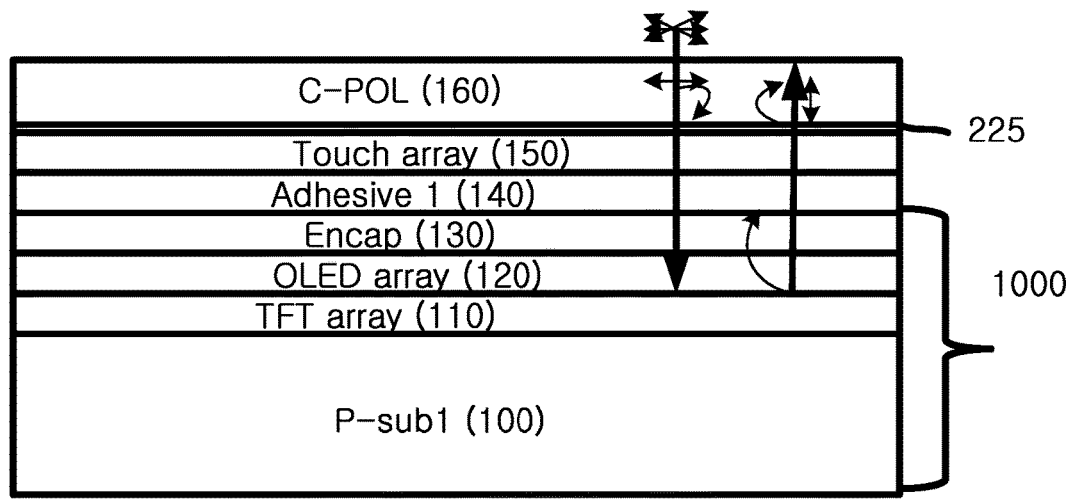
FIG. 6 is a view illustrating an optical path of an external light incident on the organic light emitting display device of FIG. 5.

FIG. 5 is a cross-sectional view illustrating an organic light emitting display device according to an embodiment of the present invention. FIG. 6 is a view illustrating an optical path of an external light incident on the organic light emitting display device of FIG. 5.

Referring to FIGS. 5 and 6, the organic light emitting display device includes an organic light emitting panel 1000 including a thin film transistor array 110 disposed on a first plastic base substrate 100, an organic light emitting diode array 120 electrically connected to the thin film transistor array 110, and an encapsulation layer 130 covering the organic light emitting diode array 120, a first adhesive layer 140 disposed on the organic light emitting panel 1000, a touch electrode array 150 contacting the first adhesive layer 140, a separation layer 225 disposed on the touch electrode array 150, and a cover film 160 disposed on the separation layer 225.

The separation layer 225 has a thickness of 100 Å or less. After a second plastic base substrate 210 (see FIG. 7A) is removed, the separation layer 225 is exposed. Namely, during a manufacture of the touch electrode array 150 using deposition and patterning processes, the second plastic base substrate 210 is maintained at a bottom side of the separation layer 225. Then, after bonding the touch electrode array 150 to the organic light emitting panel 1000, the second plastic base substrate 210 is removed. As a result, the visibility of external light due to the birefringence of the second plastic base substrate 210 can be reduced or prevented.

A surface of the separation layer 225 may not be flat. The separation layer 225 may have a non-uniform surface according to contained elements thereof. Alternatively, a part of the separation layer 225 may be removed at an upper surface of the touch electrode array 150 and the other part of the separation layer 225 may remain at the upper surface of the touch electrode array 150.

Herein, the separation layer 225 may be formed of a single element such as amorphous silicon, or a silicon group compound such as silicon nitride ($SiN_x$) and/or silicon oxide ($SiO_x$). The separation layer 225 may be a metal oxide layer formed of $Al_2O_3$, $MO_x$ and/or $TiO_2$.

Furthermore, the separation layer 225 functions to protect the touch electrode array 150 when the second plastic base substrate 210 disposed at the upper side of the touch electrode array 150 is removed after bonding the organic light emitting panel 1000 and the touch electrode array 150. Upon removal of the second plastic base substrate 210, a part of the separation layer 225 adjacent to the second plastic base substrate 210 may be removed. The separation layer 225 is provided to reduce or prevent damage such as corrosion or oxidation of a metallic touch electrode when the touch electrode array 150 is directly exposed.

The second plastic base substrate 210 may be removed by a laser releasing process. At the same time, the silicon group material or metal oxide, namely, elements of the separation layer 225 which is adjacent to the second plastic base substrate 210 is partially removed.

Meanwhile, the encapsulation layer 130 may be a face seal or a barrier stack structure composed of alternately laminated inorganic and organic layers, in order to cover the organic light emitting diode array 120.

The cover film 160 may basically include a circular polarizing plate. The cover film 160 may be a circular polarizing plate itself. In this case, the cover film may be directly coated on an exposed surface of the separation layer 225, or may be added with a separate circular polarizing plate film in an attached manner. In the former case, a phase delay layer and a linear polarizing layer are formed on the surface of the separation layer 225 to form the cover film 160. In the latter case, forming the cover film 160 includes preparing a circular polarizing plate having a film type, and directly laminating an adhesive surface of the circular polarizing plate on the separation layer 225 while a protection surface of the circular polarizing plate is exposed. Furthermore, in the case that the cover film 160 is a single circular polarizing plate, the circular polarizing plate functions to protect the organic light emitting display device from external impact. The cover film 160 has a thickness of 10 μm to 80 μm, which may be sufficient to flex the organic light emitting display device, emit light from the organic light emitting diode array 120 disposed below and reduce or prevent reflection of external light.

Alternatively, the cover film 160 may have a double-layered structure including a circular polarizing plate and a cover film. In this case, the cover film is disposed at outside corresponding to a viewed surface. The cover film is beneficially formed of a soft transparent film, not a hard material such as a glass. For example, the cover film may be formed of one selected from the group including a polyethylene group resin, a polypropylene group resin, a polyethylene terephthalate group resin, a polyvinyl alcohol group resin, a nylon group resin, a polyacrylonitrile group resin, and a polymethacrylic acid group resin. In this case, the cover film is disposed on a surface of the organic light emitting display device to protect the device from external impact. The circular polarizing plate disposed below the cover film optically functions to reduce or prevent visibility of external light.

When the cover film 160 includes a circular polarizing plate, as illustrated in FIG. 6, unpolarized external light passes through the circular polarizing plate 160 to be right-circularly polarized with respect to a transmission axis and is incident upon the touch electrode array 150, the adhesive layer 140, the encapsulation layer 130 and the organic light emitting diode array 120. The incident light is reflected by a reflection electrode included in the organic light emitting diode array 120 to be left-circularly polarized. In this case, the reflected light is thus oriented along an absorption axis crossing the transmission axis of the circular polarizing plate, and, as such, the reflected light is reduced or prevented as it does not pass though the circular polarizing plate 160.

Accordingly, the organic light emitting display device as illustrated in FIG. 5 according to an embodiment of the present invention can reduce or prevent visibility of external light. In such a structure, the separation layer 225 contacting the touch electrode array 150 between the touch electrode array 150 and the cover film 160 has a thickness of 0.01 μm (=100 Å) or less, thereby reducing or preventing movement of the transmission axis. A movement of the transmission axis may occur when an incident light passes through a plastic film before or after reflection after an external light is incident upon the circular polarizing plate 160 in the organic light emitting display device. In addition, when the light is reflected by the reflection electrode of the organic light emitting diode array 120, the reflected light may be blocked by the absorption axis of the circular polarizing plate 160.

Hereinafter, a method of manufacturing an organic light emitting display device according to an embodiment of the present invention will be described in which a removal process of an upper base substrate such as a second plastic base substrate and/or a second glass substrate is employed.

FIGS. 7A to 7D are cross-sectional views illustrating a method of removing an upper base substrate of an organic light emitting display device according to a first embodiment of the present invention.

As illustrated in FIG. 5A, a method of manufacturing an organic light emitting display device according to an embodiment of the present invention includes forming the organic light emitting panel 1000 including the thin film transistor array 110 disposed on the first plastic base substrate 100, the organic light emitting diode array 120 connected to the thin film transistor array 110, and the encapsulation layer 130 covering the organic light emitting diode array 120. In this process, when the first plastic base substrate 100 has process tolerance sufficient to endure impact such as sputtering and a high temperature process such as crystallization, the thin film transistor array 110 can be directly formed thereon. If not, a first glass substrate 250 is provided below the first plastic base substrate 100, as illustrated in FIG. 7A, the thin film transistor array 110 and the organic light emitting diode array 120 can be formed and then the encapsulation layer 130 may be formed to cover an upper surface of the organic light emitting diode array 120 and a periphery thereof.

Figure 7A:
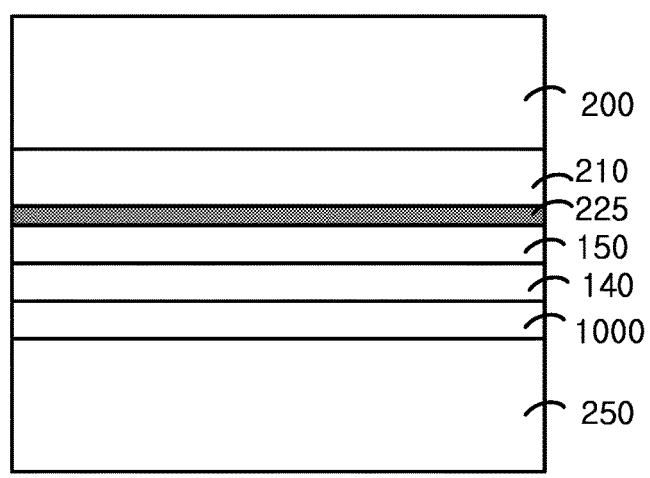
FIGS. 7A to 7D are cross-sectional views illustrating a method of removing an upper base substrate of an organic light emitting display device according to a first embodiment of the present invention.

Sequentially, as illustrated in FIG. 7A, a surface to be formed with the touch electrode array 150 may be the second plastic base substrate 210. However, before forming the touch electrode array 150, the separation layer 225 is provided to protect the touch electrode array 150 during removal of the second plastic base substrate 210. The separation layer 225 is an inorganic layer having a thickness of 0.01 μm (=100 Å) or less. The separation layer 225 may be formed of a silicon group material or may be a metal oxide layer. When the thickness of the separation layer 225 is greater than 0.01 μm, a part of the separation layer 225 may be removed by adjusting laser energy density in laser releasing during removal of the second plastic base substrate 210 of FIG. 7D, which will be described later. Furthermore, a second glass substrate 200 may be further provided below the second plastic base substrate 210 and, as such, the second plastic base substrate 210 may be sufficiently supported during formation of the first and second touch electrodes using a sputtering process.

Sequentially, the encapsulation layer 130 and the touch electrode array 150 are positioned to face each other, the first adhesive layer 140 (see FIG. 5) is interposed therebetween, and the encapsulation layer 130 and the touch electrode array 150 are bonded to one another.

Meanwhile, each of the first and second glass substrates 250 and 200 has a thickness of 0.5 mm or more. This increases the thickness of the device, thereby decreasing the flexibility of the device. As such, the first and second glass substrates 250 and 200 are removed. First, the second glass substrate 200 is removed, and then the first glass substrate 250 is removed. This will be described later.

Figure 7B:
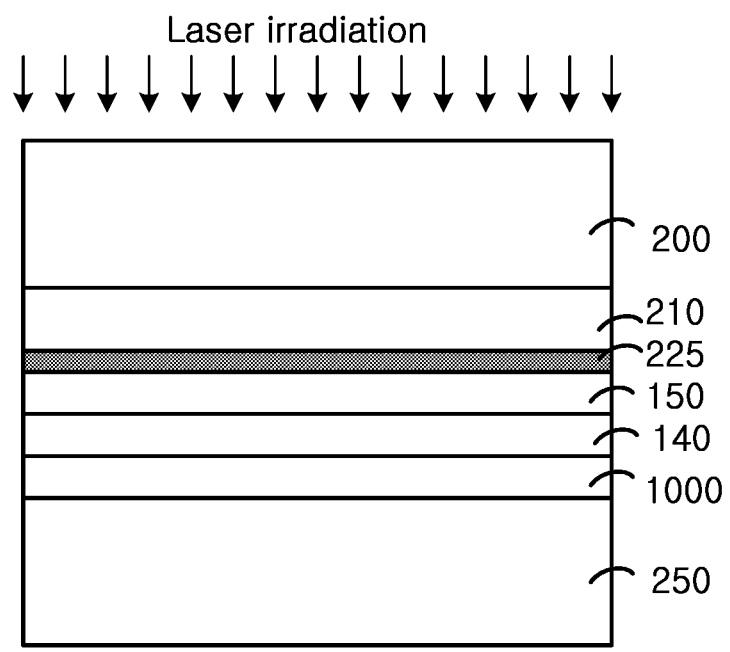
Figure 7C:
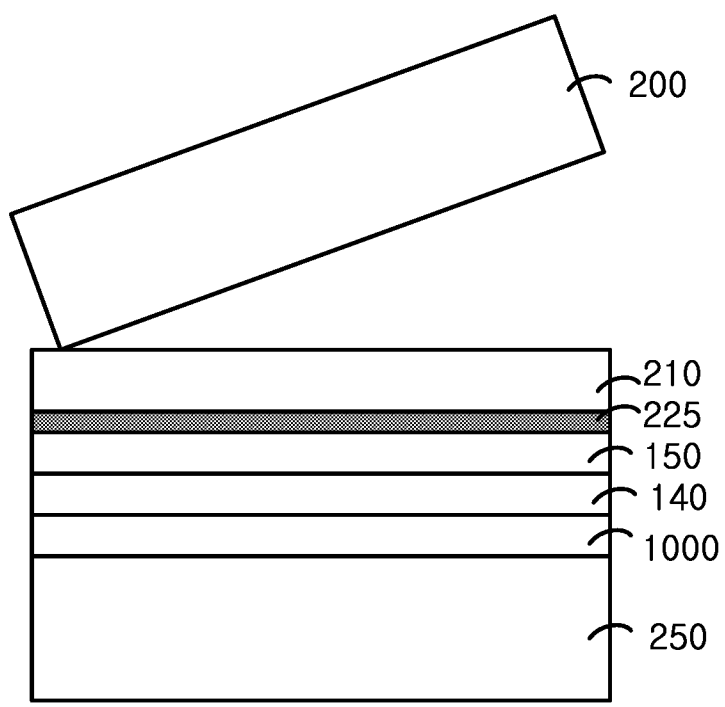

As illustrated in FIGS. 7B and 7C, the second glass substrate 200 is first released and removed by irradiating a laser as illustrated in FIG. 7C.

Figure 7D:
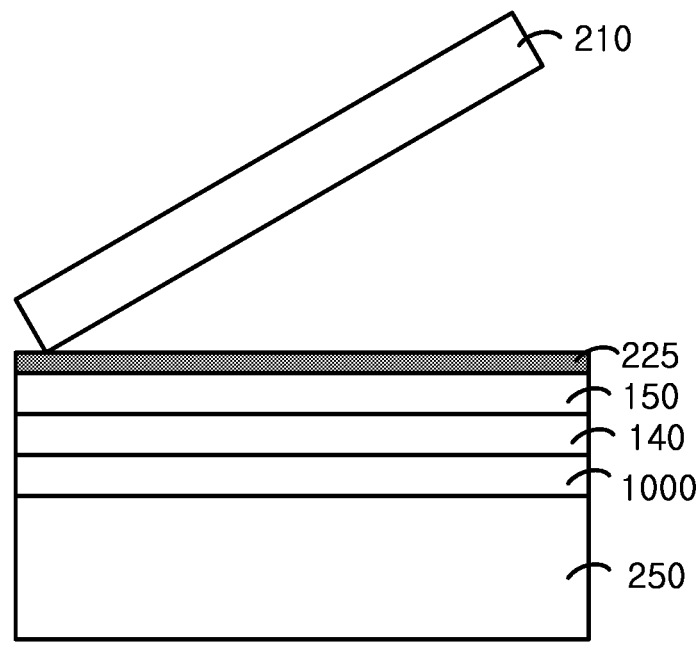

In succession, as illustrated in FIG. 7D, the exposed second plastic base substrate 210 is removed up to the separation layer 225 as a boundary. The second plastic base substrate 210 is thin and transparent, and thus, the separation layer 225 may be stripped by raising a corner thereof.

After the second glass substrate 200 and the second plastic base substrate 210 are removed, the first glass substrate 250 disposed therebelow is removed using a laser, although not shown.

Meanwhile, an element of the removed second plastic base substrate 210 may include a polymer compound. The element may include at least one selected from the group consisting of polyester, copolymer including polyester, polyimide, copolymer including polyimide, olefin group copolymer, polyacrylic acid, copolymer including polyacrylic acid, polystyrene, copolymer including polystyrene, polysulfate, copolymer including polysulfate, polycarbonate, copolymer including polycarbonate, polyamic acid, copolymer including polyamic acid, polyamine, copolymer including polyamic acid, polyvinyl alcohol, polyallylamine. The removed second plastic base substrate 210 may have a thickness of about 20 μm to 100 μm.

Figure 8A:
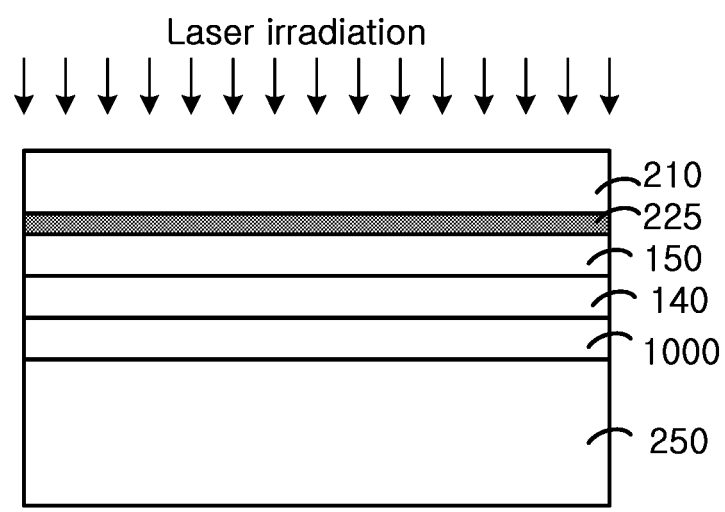
FIGS. 8A and 8B are cross-sectional views illustrating a method of removing an upper base substrate of an organic light emitting display device according to a second embodiment of the present invention.
Figure 8B:
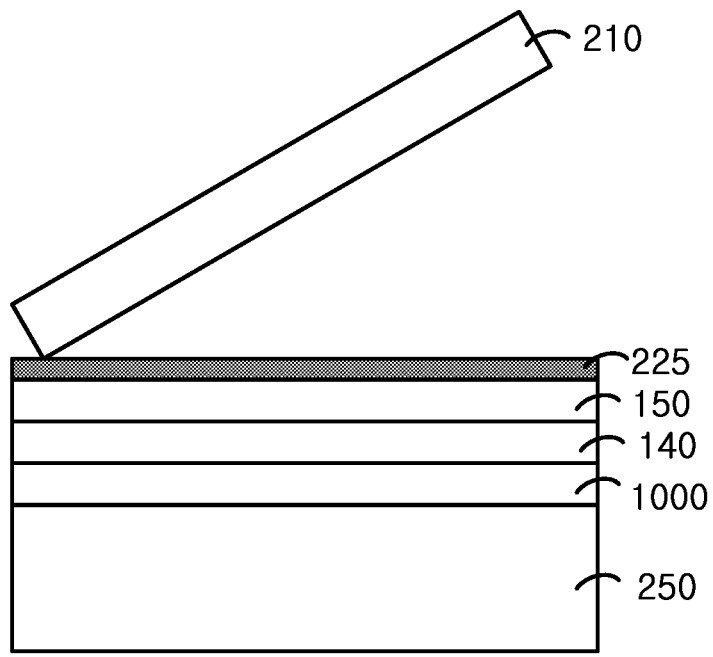

FIGS. 8A and 8B are cross-sectional views illustrating a method of removing an upper base substrate of an organic light emitting display device according to a second embodiment of the present invention.

In the second embodiment, the second plastic base substrate 210 as illustrated in FIG. 8A is directly irradiated by a laser. As illustrated in FIG. 8B, the second plastic base substrate 210 may be stripped by raising it from the separation layer 225.

After removal of the second plastic base substrate 210, because the separation layer 225 is very thin and transparent, the touch electrode array 150 may be visible through the naked eye.

Figure 9A:
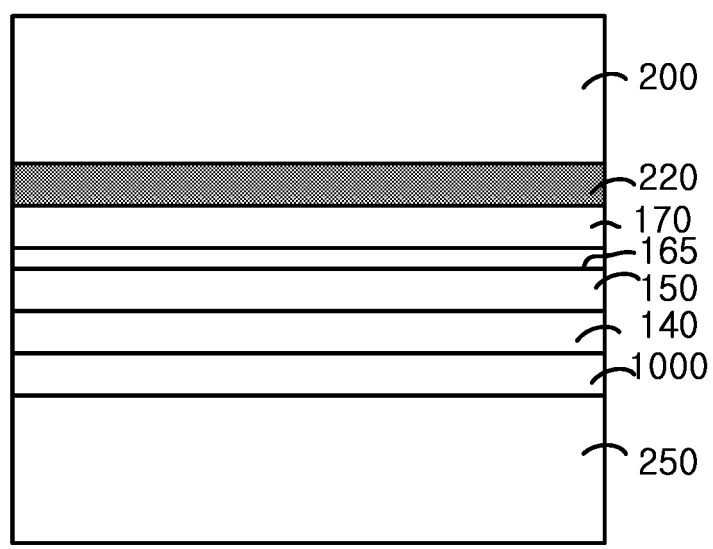
FIGS. 9A to 9C are cross-sectional views illustrating a method of removing an upper base substrate of an organic light emitting display device according to a third embodiment of the present invention.
Figure 9B:
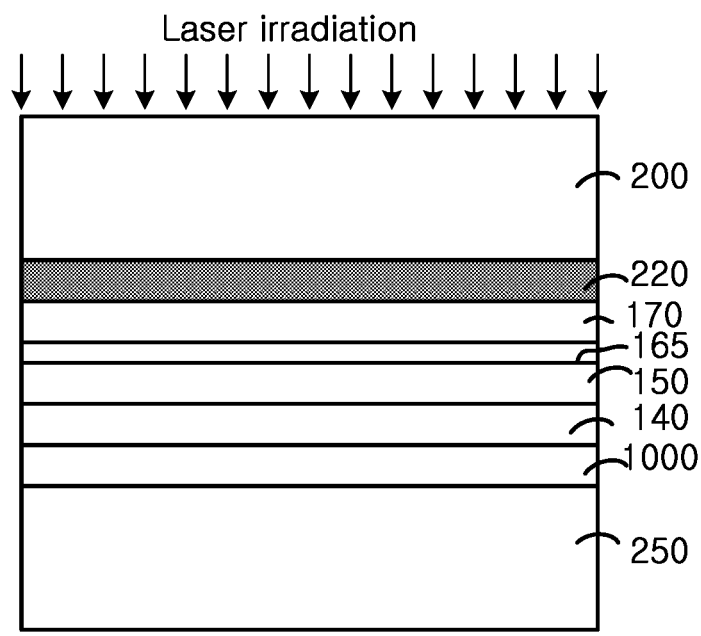
Figure 9C:
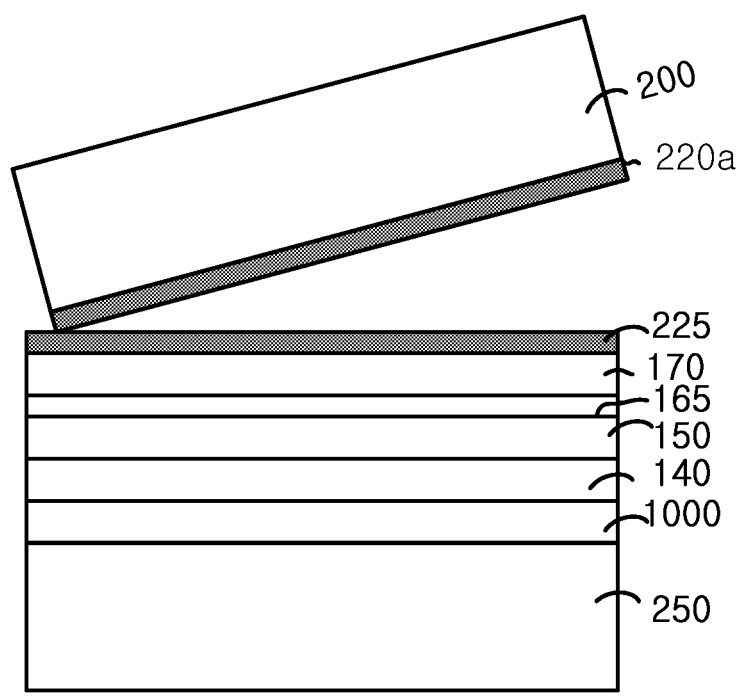

FIGS. 9A to 9C are cross-sectional views illustrating a method of removing an upper base substrate of an organic light emitting display device according to a third embodiment of the present invention.

In the third embodiment, the method of removing the upper base substrate of the organic light emitting display device, as illustrated in FIG. 9A, includes sequentially forming a sacrificial layer 220 directly disposed on the second glass substrate 200, a buffer layer 170, and a barrier layer 165 without the second plastic base substrate 210, and forming the touch electrode array 150. Since the second plastic base substrate 210 is not used, the buffer layer 170 and the barrier layer 165 may be further provided to protect the touch electrode array 150.

A removal process will be described in detail. The sacrificial layer 220 is formed of amorphous silicon, a silicon dielectric layer or a metal oxide layer. The buffer layer 170 is an organic layer having a thickness of 1 μm to 8 μm. The barrier layer 165 is an inorganic layer having a thickness of 500 Å to 3,000 Å. In this case, when the touch electrode array 150 is formed, at least one of the electrodes of the touch electrode array 150 is formed to directly contact the barrier layer 165.

In addition, in the state that such a structure is maintained, the first glass substrate 250 may be bonded to the organic light emitting display device 1000 having the above structure.

In this case, as illustrated in FIG. 9B, the second glass substrate 200 is irradiated with a laser. As illustrated in FIG. 9C, the second glass substrate 200 and a part 220a of the sacrificial layer 220 are removed. During the removal process, as illustrated in FIG. 9C, a part of the sacrificial layer 220 may remain at the separation layer 225. The thickness of separation layer 225, as described above, may be 100 Å or less.

In addition, since the separation layer 225 is very thin, the separation layer 225 may not have a flat surface. One region of the separation layer 225 may be removed to expose the buffer layer 170, and the other region may remain to have a thin thickness.

Meanwhile, in a process of FIG. 9C, the separation layer 225 may be completely removed. In this case, during removal of the separation layer 225, a part of the buffer layer 170 may be removed and exposed. In this process, the buffer layer 170 functions to protect against physical impact such as radiation of laser.

In the third embodiment, since the plastic base substrate on the touch electrode array 150, which generates birefringence, is omitted, the same effect as removal of the second plastic base substrate in the first and second embodiments may be obtained.

Furthermore, after removal of the upper base substrate of the first to third embodiments as described above, the first glass substrate 250 disposed below may be removed using a laser. The removal process of the first glass substrate 250 is similar to the removal process of the second glass substrate or the second plastic base substrate.

Meanwhile, after the separation layer 225 is exposed by removal of the second plastic base substrate 210 and/or the second glass substrate 200, a second adhesive layer 320 (see FIG. 10) may be disposed on the exposed separation layer 225 and the cover film 160 may be attached to the separation layer 225.

Hereinafter, effectiveness of a method of manufacturing an organic light emitting display device according to an embodiment of the present invention will be described through composition analysis of a picture, which captures an exposed upper surface after removal of the second glass substrate or the second plastic base substrate used as a support substrate or a formation substrate of the touch electrode array in the organic light emitting display device.

Figures 10, 11:
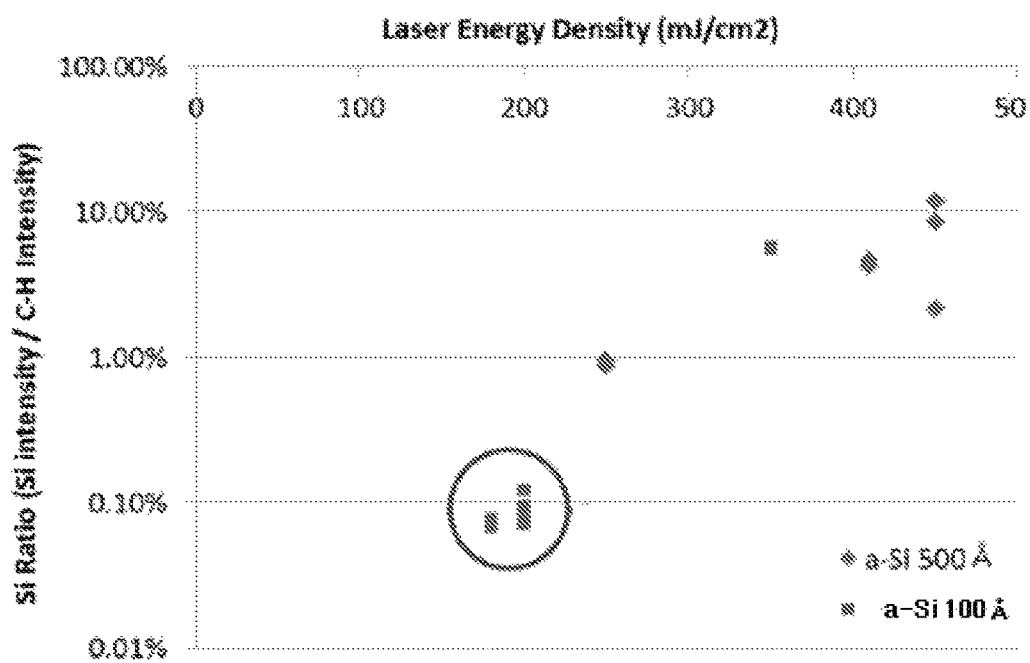
FIG. 10 show pictures capturing an upper surface of FIG. 9C using measurement equipment after removing the upper base substrate of the organic light emitting display device through the method of FIGS. 9A to 9C.
FIG. 11 is a graph measuring a laser energy density vs a Si ratio at the upper surface of FIG. 9C after removing the upper base substrate of the organic light emitting display device through the method of FIGS. 9A to 9C.

FIG. 10 show pictures capturing the upper surface of FIG. 9C using a measurement equipment after removing the upper base substrate of the organic light emitting display device through the method of FIGS. 9A to 9C. FIG. 11 is a graph measuring a laser energy density vs a Si ratio at the upper surface of FIG. 9C after removing the upper base substrate of the organic light emitting display device through the method of FIGS. 9A to 9C.

In particular, FIG. 10 are image pictures of the composition of the exposed upper surface of the separation layer 225 after removal of the second plastic base substrate 210 and/or the second glass substrate 200 using a time of flight secondary mass spectrometer (ToF-SIMS).

In FIG. 10, the separation layer having a thickness of 100 Å is tested twice when each laser energy density is 220 mJ/cm and 180 mJ/cm. Results of the laser energy density of 220 mJ/cm are referred as to #1 and #2, and results of the laser energy density of 180 mJ/cm are referred as to #3 and #4. In addition, FIG. 10 shows the composition of the measured elements. As the brightness of the image picture increases, an amount of the element increases. In other words, as the color of the image picture is gradually close to black, the amount of the element becomes smaller.

Herein, during removal of the upper base substrate, when the separation layer is very thin, the buffer layer is exposed by the partially removed separation layer. H, CH, and O are elements of the exposed buffer layer.

In addition, a single element such as Si or a silicon compound bonded to hydrogen such as SiH is an element of the separation layer.

Under the condition of #1 to #4, Si or SiH, namely, the element of the separation layer, is about 0.01% to 0.2% (169/967,379) in comparison with H, CH, or O, namely, the element of the buffer layer. It is noted that the amount of the element of the remaining separation layer is very small. Thus, this is not optically or electrically influenced to the other devices in the organic light emitting display device.

FIG. 11 illustrates composition between C—H (a main element of the buffer layer) versus Si (a main element of the separation layer) in the case of the separation layer having a thickness of 200 Å and in the case of the separation layer having a thickness of 500 Å. In the case of the thickness of 200 Å, the separation layer contains 0.1% Si. In the case of the thickness of 500 Å, the separation layer contains 1% Si. It is noted that the remaining amount of Si is proportional to the thickness of the separation layer.

The separation layer according to an embodiment of present invention is an inserted layer for removing the upper base substrate of the touch electrode array. In other words, the separation layer is not an optical or electrical layer in the device. Accordingly, the thickness of the separation layer is beneficially 100 Å or less to not influence the other functional layers in the device.

In addition, when the separation layer is formed of silicon or is a metal oxide layer, the separation layer may have semiconductive or conductive characteristics. Alternatively, the separation layer may be completely removed to drive a sensitive touch electrode array. In this case, although the separation layer is removed, the touch electrode array should be not exposed. To do so, as illustrated in FIG. 9A, the barrier layer 165 and the buffer layer 170 are provided on the touch electrode array 150 to protect the touch electrode array 150 from external physical stress due to removal of the separation layer.

Hereinafter, various embodiments of an organic light emitting display device will be described. The organic light emitting display device which includes the structure of FIG. 5 as the basic structure may be modified in the following various embodiments.

Figure 12:
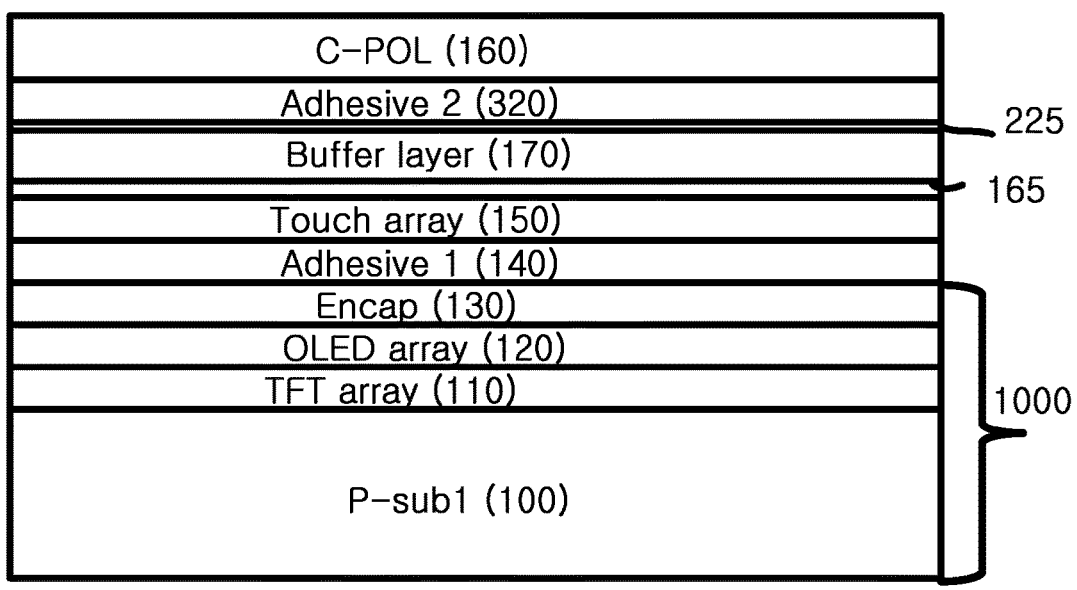
FIG. 12 is a cross-sectional view illustrating an organic light emitting display device according to a first embodiment of the present invention.
Figure 13:
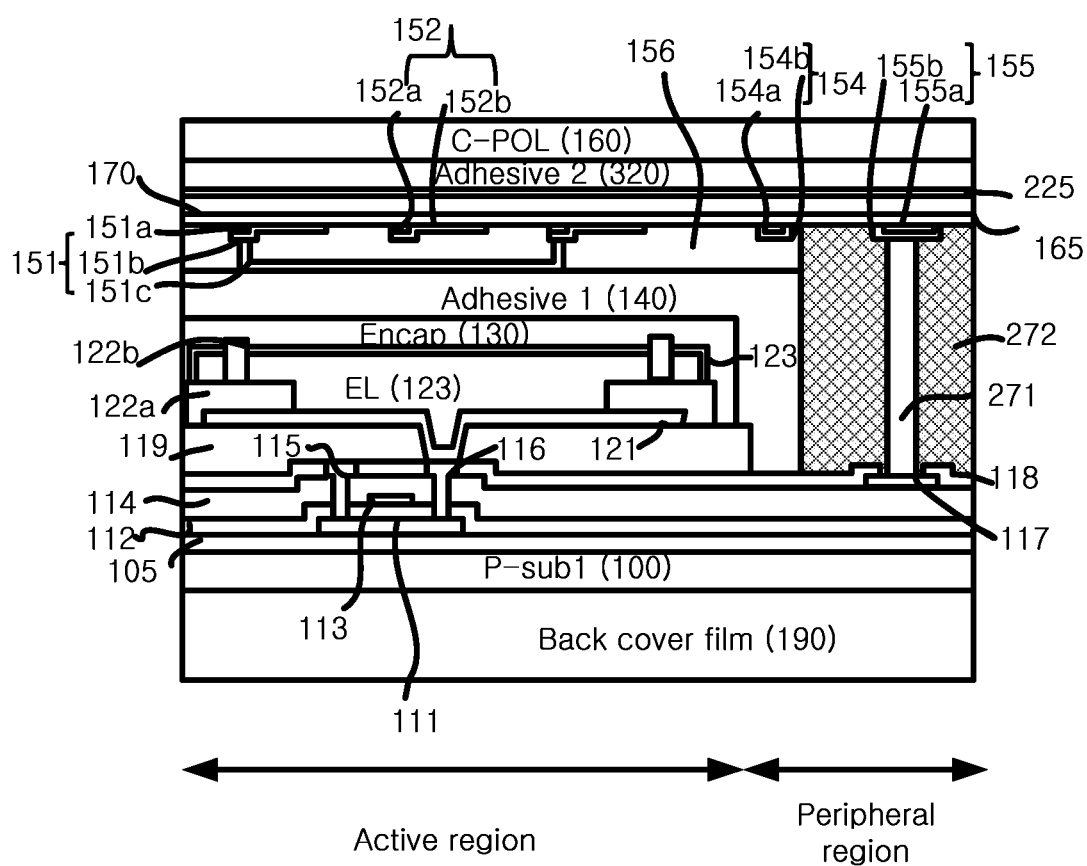
FIG. 13 is a cross-sectional view specifically illustrating the organic light emitting display device according to the first embodiment of the present invention.

FIG. 12 is a cross-sectional view illustrating an organic light emitting display device according to a first embodiment of the present invention. FIG. 13 is a cross-sectional view specifically illustrating the organic light emitting display device according to the first embodiment of the present invention.

As illustrated in FIG. 12, the organic light emitting display device according to the first embodiment of the present invention includes an organic light emitting panel 1000 including a thin film transistor array 110 disposed on a first plastic base substrate 100, an organic light emitting diode array 120 electrically connected to the thin film transistor array 110, and an encapsulation layer 130 covering the organic light emitting diode array 120, a first adhesive layer 140 disposed on the organic light emitting panel 1000, a touch electrode array 150 contacting the first adhesive layer 140, a barrier layer 165, a buffer layer 170 and a separation layer 225 sequentially disposed on the touch electrode array 150, and a cover film 160 disposed on the separation layer 225.

Herein, before bonding the organic light emitting panel 1000 and the touch electrode array 150, the separation layer 225, the buffer layer 170, and the barrier layer 165 are from upside sequentially formed on a second glass substrate 200 (see, FIG. 7A) or a second plastic base substrate 210. After removal of the second glass substrate 200 and the second plastic base substrate 210, in the state that the separation layer 225 is exposed, the cover film 160 is attached to the separation layer 225 through a second adhesive layer 160. In this case, the second adhesive layer 160 is disposed between the separation layer 225 and the cover film 160 such that the separation layer 225 and the cover film 160 are in contact with an upper surface and a lower surface of the second adhesive layer 320, respectively.

A difference from the basic structure of FIG. 5 is the addition of the buffer layer 170 and the barrier layer 165 to protect the touch electrode array 150.

The barrier layer 165 is an inorganic layer having a thickness of 500 Å to 3000 Å. The buffer layer is an organic layer having a thickness of 1 µm to 8 µm. The organic buffer layer acting as a buffer against physical stress such as a laser is adjacent to the separation layer 225. Furthermore, the barrier layer 165 directly contacts the touch electrode array 150. The barrier layer 165 functions to reduce or prevent a touch electrode, a routing wire, or a touch pad electrode from being directly exposed during a removal process of the second plastic base substrate or the second glass substrate. The barrier layer 165 may be formed of the same material as an insulation layer constituting the touch electrode array.

In detail, the buffer layer 170 may include an organic layer formed of at least one of acrylic group, epoxy group, polyimide group, and polyamide. The barrier layer 165 may include a single layer such as an oxide layer or a nitride layer, or multiple layers of an oxide layer or a nitride layer, or alternately laminated layers of an oxide layer and a nitride layer. The buffer layer 170 and the barrier layer 165 are transparent and have a reflectivity of 5% or less. As a result, the buffer layer 170 and the barrier layer 165 may direct the light emitted from the organic light emitting diode array 120 without loss. As the buffer layer 170 has a thickness range from 1 µm to 8 µm, there may be no birefringence upon introduction of external light. Even if there is birefringence, an amount of birefringence may be maintained at an invisible level.

Meanwhile, according to the first embodiment, the cover film 160 is a circular polarizing plate itself. When an unpolarized external light is incident along a certain transmission axis of the circular polarizing plate, the light is left-circularly polarized or right-circularly polarized. Then, when the light is reflected at the first electrode 121 (FIG. 13) of a reflective electrode element of the organic light emitting diode array 120, the light is right-circularly polarized or left-circularly polarized to proceed to the circular polarizing plate in an opposite direction. Herein, the reflected light is blocked by the absorption axis to reduce or prevent reflection of external light.

In detail, internal constituents of the organic light emitting display device according to the first embodiment of the present invention in FIG. 13 will now be described.

As illustrated in FIG. 13, a TFT buffer layer 105 including a plurality of inorganic layers may be further provided on the first plastic base substrate 100. When wiring or an active layer is directly formed on the first plastic base substrate 100, the TFT buffer layer 105 allows a surface of the wiring or active layer to be uniform.

The thin transistor array 110, the organic light emitting diode array 120, and the touch electrode array 150 in an active region are disposed at the same level as the thin transistor array 110, the organic light emitting diode array 120, and the touch electrode array 150 in a peripheral region. In addition, in a planar view, a plurality of pixels are arranged in a matrix in the active region. Each thin transistor array 110 includes gate lines and data lines, which cross each other. In this case, each pixel is disposed at every crossing point and includes at least one thin film transistor (TFT). The organic light emitting diode array 120 includes organic light emitting diodes (OLEDs). The touch electrode array 150 includes first touch electrodes 151 and second touch electrodes 152, which cross each other. The crossing point of the first and second touch electrodes 151 and 152 may correspond to each pixel. Alternatively, an arrangement of the first and second touch electrodes 151 and 152 may be unrelated to an arrangement of the pixels.

Furthermore, a pad part is disposed in a peripheral region of the thin transistor array 110. The touch electrode array 150 includes a touch pad part partially connected to the pad part of the thin film transistor array 110. Herein, since the pad part of the thin film transistor array 110 is connected to the touch pad part, a separate a flexible printed circuit (FPC) connection may not be needed at the touch electrode array 150 side to receive a touch control signal from the thin transistor array 110. As a result, the manufacturing process may be simplified and the FPC connection may be minimized The thin transistor (TFT) in the pixel of the thin pixel transistor array 110 includes an active layer 111 on the TFT buffer layer 105, a gate dielectric layer 112 covering the active layer 111 while being formed on the TFT buffer layer 105, a gate electrode 113 overlapping the active layer 111, an interlayer dielectric 114 formed on the gate electrode 113 and the gate dielectric layer 112, and a source electrode 115 and a drain electrode 116 passing through the interlayer dielectric 114 and the gate dielectric layer 112 to connect both ends of the active layer 112, respectively. At least one touch auxiliary pad electrode 117 may be formed on a same layer with the source electrode 115 and the drain electrode 116. On the interlayer dielectric 114, a TFT protective layer 118 is formed to expose at least the drain electrode 117 and a part of the touch auxiliary pad electrode 117. Herein, the gate electrode 113 may be disposed at the same level as the gate line. The source electrode 115 and the drain electrode 116 may be disposed at the same level as the data line. Also, a planarization film is formed on the TFT protective layer 118, in at least an active area.

Pad electrodes for the gate line and the data line and a second electrode pad electrode grounding the second electrode of the organic light emitting diode array or applying a uniform voltage thereto are provided in the peripheral region of the thin film transistor array. Furthermore, as illustrated, a touch auxiliary electrode 117 connected to the touch pad electrode 155 of an upper surface of the touch pad electrode array 150 may be further provided.

The organic light emitting diode (OLED) includes a first electrode connected to the drain electrode 116, an organic light emitting layer 123 formed in a bank 122a defining a light emitting region, and a second electrode 124 covering the organic light emitting layer 123.

Optionally, spacers 112b having a certain thickness corresponding to a width of the bank 112a may be provided on the bank 122a. When the organic light emitting layer 123 is formed, organic material is disposed at the first plastic base substrate 100 using a metal mask having an opening. In this case, the metal mask droops such that the bank 122a collapses or the light emitting region is influenced to an inner the emitting region. To this end, the spacers 112b are regularly provided on the bank 112a. Meanwhile, the first electrode is a reflection electrode and the second electrode 124 is a transparent electrode. The external light is reflected at the first electrode 121 after passing through the organic light emitting diode (OLED). Then, the reflected light proceeds through the transparent second electrode 124.

In addition, the encapsulation layer 130 is formed on the organic light emitting diode array 120 to cover the upper side and the profile side of the organic light emitting diode (OLED).

The touch electrode array 150 includes the first and second touch electrodes 151 and 152 which cross each other in the active region, a protective layer 156 covering the first and second touch electrodes 151 and 152, a plurality of touch pad electrodes 155 corresponding to the first and second touch electrodes 151 and 152 in the peripheral region, and a routing wire 154 transferring signals from the touch pad electrodes 155 to the first and second touch electrodes 151 and 152.

In the illustrated embodiment, the first and second touch electrodes 151 and 152, the routing wire 154, and the touch pad electrodes 155 include metal mash patterns 151a, 152a, 154a, and 155a disposed at an upper side and transparent electrodes 151b, 152b, 154b, and 155b disposed at a lower side, respectively. Each of the first and second touch electrodes 151 and 152, the routing wire 154, and the touch pad electrodes 155 has a double-layered electrode structure, thereby realizing a stable electric field and low resistance. However, the present invention is not limited by such an electrode structure including the metal mash patterns. An organic light emitting display device according to an embodiment of the present invention may include a single-layer electrode structure.

Furthermore, since the first touch electrodes 151 and the second touch electrodes 152 are disposed at the same level in order to reduce or prevent a short circuit between the first and second touch electrodes 151 and 152, the first touch electrodes are connected to each other by a bridge pattern 151c disposed through a contact hole in the protective layer 140. As a result, the first touch electrodes 151 are electrically isolated from the second touch electrodes 152.

As illustrated in FIG. 13, the first and second touch electrodes 151 and 152, the routing wire 154, and the touch pad electrodes 155 are in contact with the barrier layer 165. The protective layer 156 may be in contact with the first adhesive layer 140 for bonding the encapsulation layer 130 and the touch electrode array 150.

The barrier layer 165 is in contact with the organic buffer layer 170. The buffer layer 170 is in contact with the separation layer 225 formed of a silicon material or a metal oxide layer. The cover film 160 functioning as a circular polarizing plate is attached to the separation layer 225. The second adhesive layer 320 may be disposed between the cover film 160 and the separation layer 225 or be omitted. In the latter case, the circular polarizing plate includes an adhesive surface corresponding to a surface of the separation layer 225.

Meanwhile, in the peripheral region, a seal material 272 including a conductive bead 271 is provided. The conductive bead 271 is disposed at a part corresponding to the touch auxiliary pad electrode 117 through the TFT protective layer 118 to be vertically connected between the touch pad electrode 155 and the touch auxiliary pad electrode 117.

In addition, the first plastic base substrate 100 may be formed of a polymer compound. The first plastic base substrate 100 may include at least one selected from the group including polyester, copolymer including polyester, polyimide, copolymer including polyimide, olefin group copolymer, polyacrylic acid, copolymer including polyacrylic acid, polystyrene, copolymer including polystyrene, polysulfate, copolymer including polysulfate, polycarbonate, copolymer including polycarbonate, polyamic acid, copolymer including polyamic acid, polyamine, copolymer including polyamic acid, polyvinyl alcohol, polyallylamine. The first plastic base substrate has relatively a high heat-resisting property in comparison with the second plastic base substrate 210. The first plastic base substrate 100 may have a thickness of 5 μm to 100 μm.

In addition, a back cover film 190 is further provided below the first plastic base substrate 100 to protect the first plastic base substrate 100. The back cover film 190 is thicker than the plastic base substrate 100 and has a higher hardness than the plastic base substrate 100.

Figure 14:
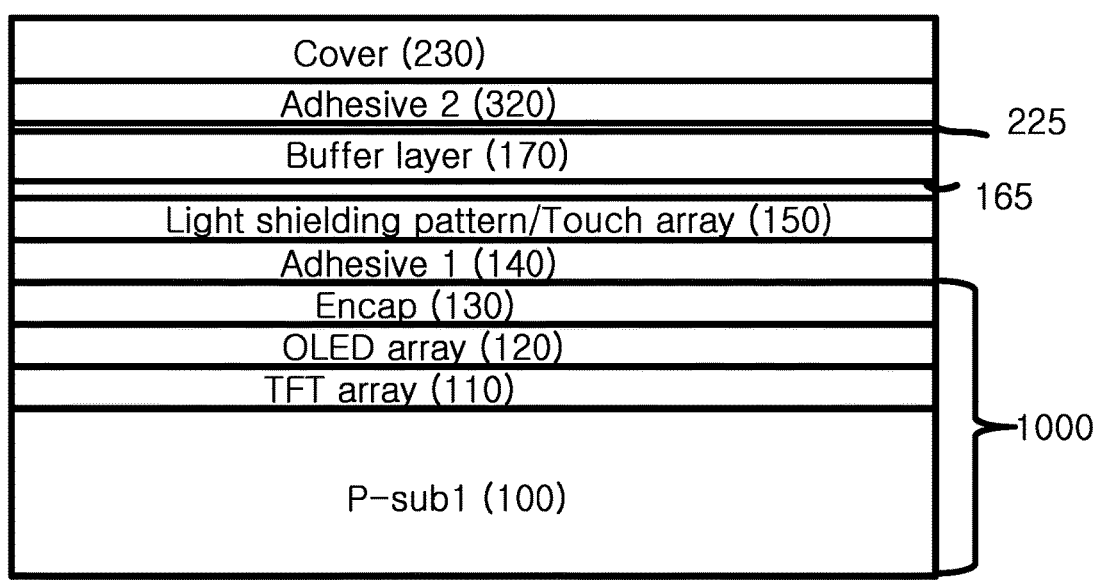
FIG. 14 is a cross-sectional view illustrating an organic light emitting display device according to a second embodiment of the present invention.
Figure 15:
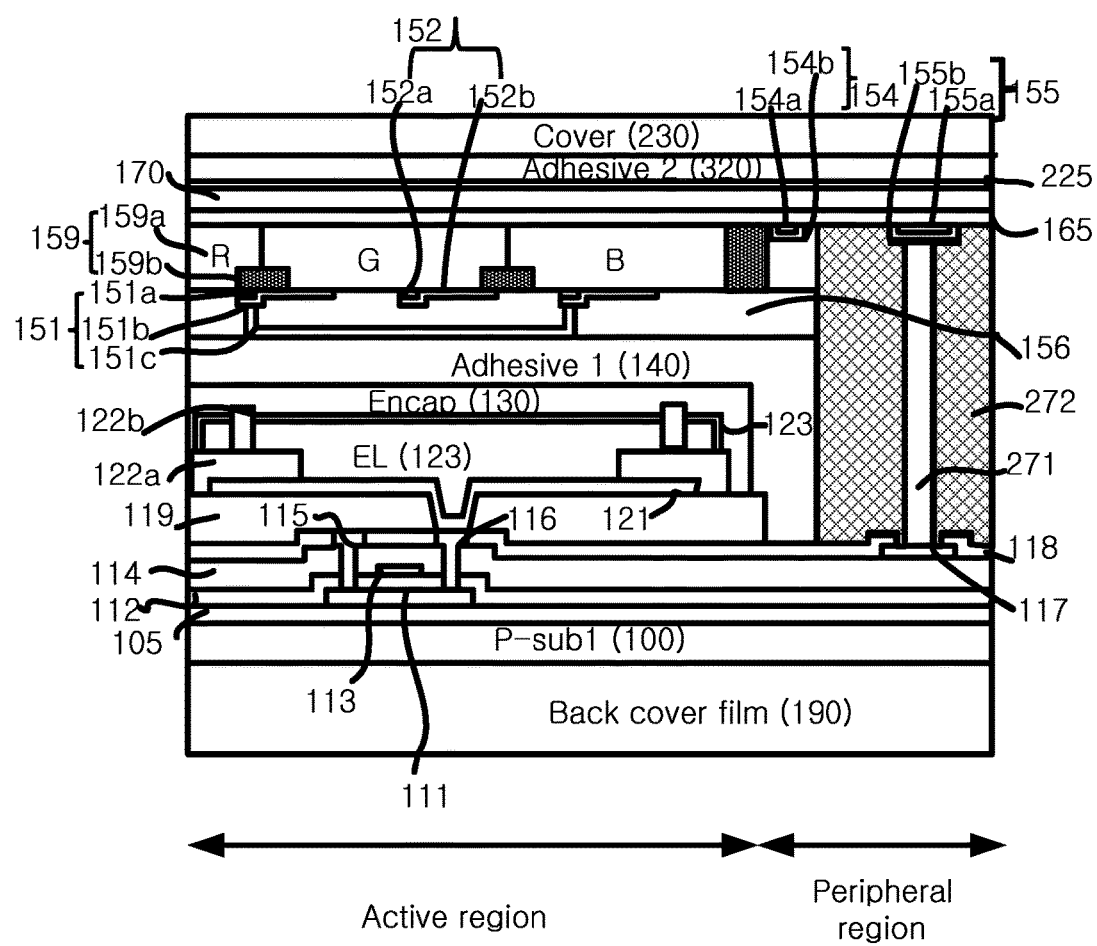
FIG. 15 is a cross-sectional view specifically illustrating the organic light emitting display device according to the second embodiment of the present invention.
Figure 16:
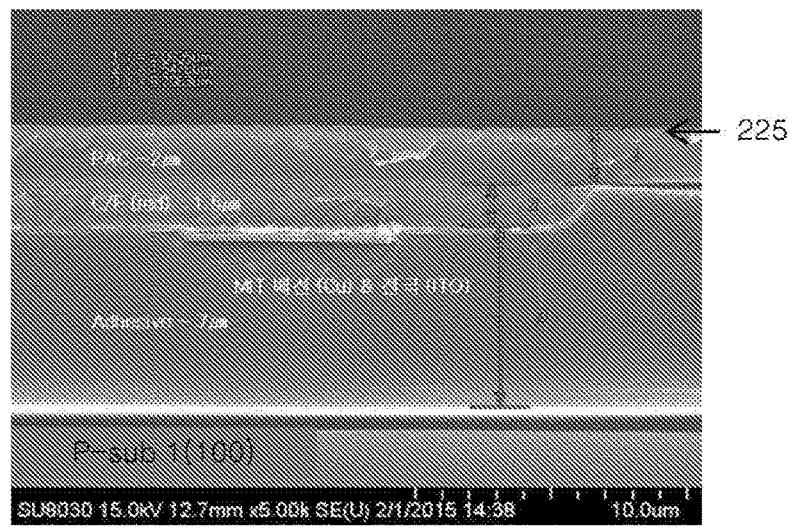
FIG. 16 is an SEM of the organic light emitting display device according to the second embodiment of the present invention.

FIG. 14 is a cross-sectional view illustrating an organic light emitting display device according to a second embodiment of the present invention. FIG. 15 is a cross-sectional view specifically illustrating the organic light emitting display device according to the second embodiment of the present invention. FIG. 16 is an SEM of the organic light emitting display device according to the second embodiment of the present invention.

As illustrated in FIGS. 14 and 15, the organic light emitting display device according to the second embodiment of the present invention includes an external light shielding pattern 159 including a color filter layer 159a and a black matrix layer 159b disposed at the touch electrode array 150 side, rather than the circular polarizing plate disposed at an outmost side in comparison with the first embodiment. As a result, visibility of external light can be reduced or prevented. In this case, the external light shielding pattern 159 is disposed at an entire active region and a part of the peripheral region excluding the touch pad part. A cover film 230 is provided to protect the outside surface of the device. The cover film 230 may be a transparent protective film. Herein, the color filter layer 159a may include a red color filter, a green color filter, and a blue color filter according to desired colors of the organic light emitting layer of the organic light emitting diode array 120.

Meanwhile, in the second embodiment of the present invention, the routing wire 154 and the pad electrode 155 are in contact with the barrier layer 165. The external light shielding pattern 159 is inserted between the first and second touch electrodes 151 and 152 and the barrier layer 165. Such a disposition of the external light shielding pattern 159 is merely an example. The first and second touch electrodes 151 and 152 may be in contact with the barrier layer 165, and the external light shielding pattern 159 may be disposed farther from the barrier layer 165. The color filter 159a and the black matrix layer 159b of the external light shielding pattern 159 may be dividedly disposed at different layers in an inserted manner, similar to the disposition of the first and second touch electrodes 151 and 152.

Elements in FIG. 15 of the same reference numerals used in FIG. 13 have the identical functions. As such, the duplicative description thereof will be omitted.

FIG. 16 shows the exposed separation layer 225 after removal of the upper base substrate in the organic light emitting display device according to the second embodiment of the invention. The real separation layer 225 has a thickness of $\frac{1}{50}$ to $\frac{1}{20}$ as thin as the buffer layer 170 or the color filter layer 159a of the touch electrode array 150. The upper base substrate is removed up to the separation layer 225 used as a boundary, thereby protecting the touch electrode array 150.

In the second embodiment, the upper base substrate is removed to reduce or prevent birefringence caused by the upper base substrate. As a result, visibility of external light is decreased, and optical characteristics may be improved. Since a total thickness of the device is reduced by, for example, 20 μm to 100 μm due to removal of the upper base substrate, the organic light emitting display device can have a slimmer profile.

Figure 17:
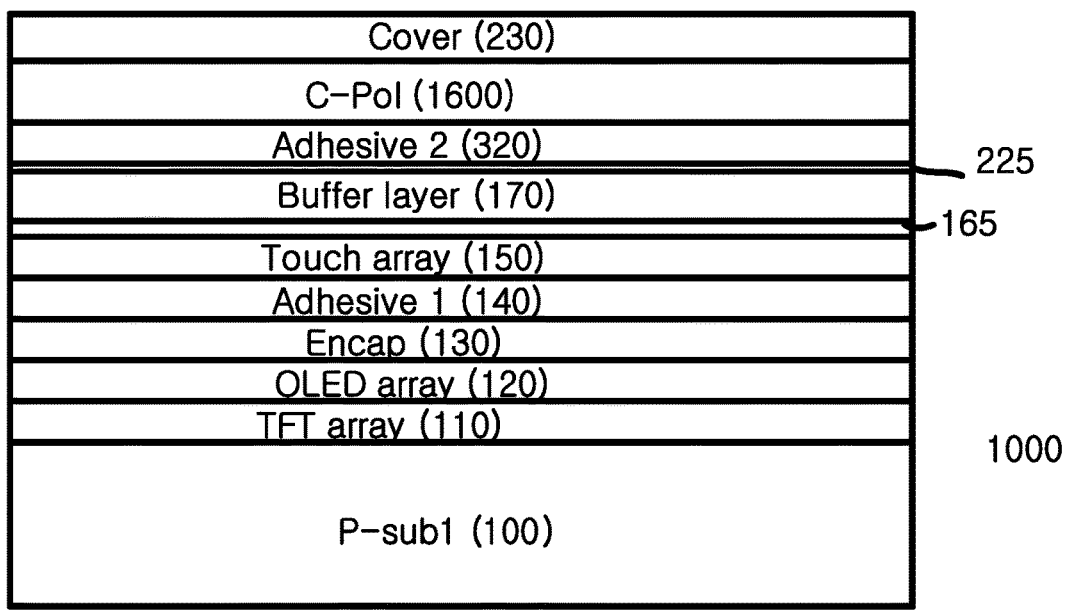
FIG. 17 is a cross-sectional view illustrating an organic light emitting display device according to a third embodiment of the present invention.

FIG. 17 is a cross-sectional view illustrating an organic light emitting display device according to a third embodiment of the present invention.

As illustrated in FIG. 17, the organic light emitting panel 1000, the first adhesive 140, and the touch electrode array 150 as described in the first embodiment are employed to the organic light emitting display device according to the third embodiment of the present invention. The barrier layer 165, the buffer layer 170, and the separation layer 225 are sequentially provided on the touch electrode array 150 and a circular polarizing plate 1600 and the cover film 230 are sequentially provided on the separation layer 225.

The circular polarizing plate 1600, as described above, has a function of reducing or preventing visibility of external light. The circular polarizing plate 1600 may be formed by attaching a film or by sequentially coating a phase delay layer and a linear polarizing layer.

The cover film 230 is a flexible transparent film and has a function of protection of a surface of the device from the outside. For example, the cover film 230 may be selected from the group including a polyethylene group resin, a polypropylene group resin, a polyethylene terephthalate group resin, a polyvinyl alcohol group resin, a nylon group resin, a polyacrylonitrile group resin, and a polymethacrylic acid group resin.

Figure 18:
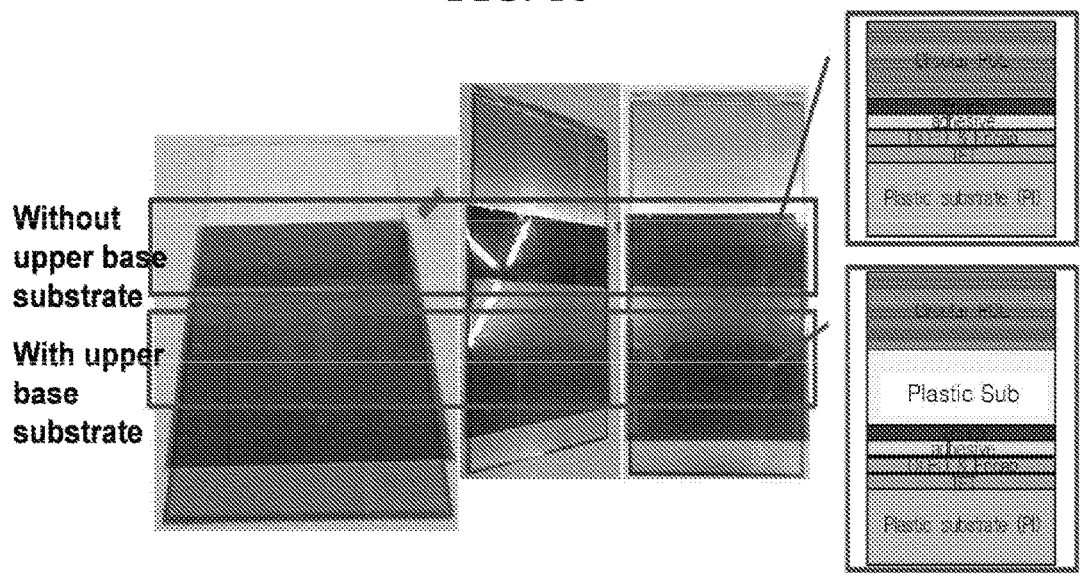
FIG. 18 show pictures of an organic light emitting display device when an upper material is maintained and removed, as viewed from an upper side, a profile side and a front side.

FIG. 18 show pictures of an organic light emitting display device with or without an upper base substrate, as viewed from an upper side, a profile side and a front side.

As illustrated in FIG. 18, when the second plastic base substrate used as a formation surface of the touch electrode array is maintained, the reflected light may be visible at a black state. When the second plastic base substrate or the second glass substrate is removed according to embodiments of the present invention, reflection of external light, which can be seen by an observer, can be reduced or prevented.

Figure 19:
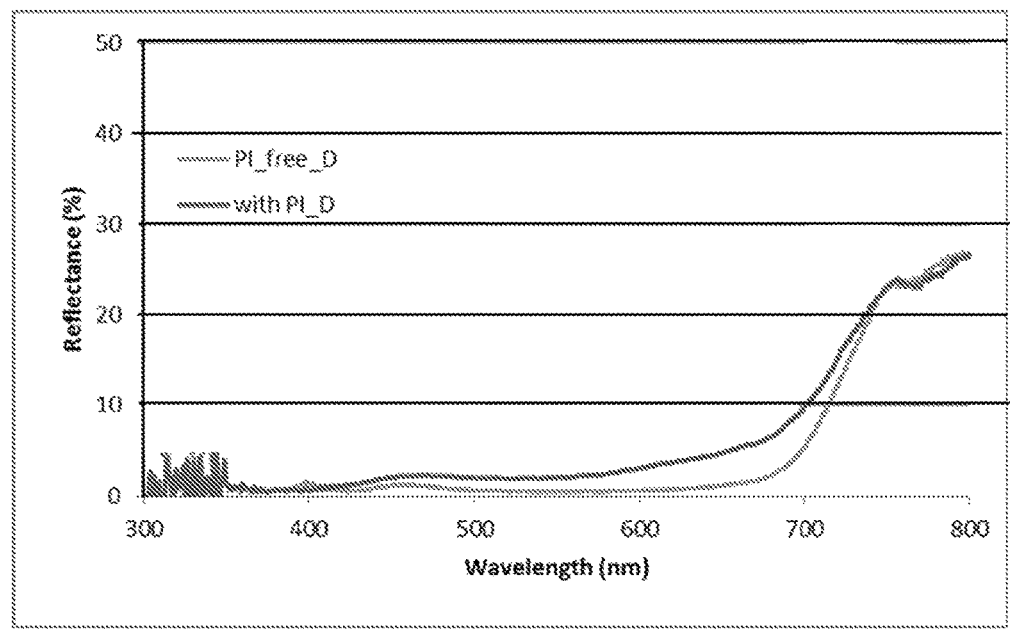
FIG. 19 is a graph illustrating reflectivity changes with respect to wavelength changes when an upper material is maintained and removed.

FIG. 19 is a graph illustrating reflectivity changes with respect to wavelength changes when an upper material is maintained and removed.

As shown in FIG. 19, between 400 nm to 700 nm, that is, wavelengths of visible light, there is a difference of reflectivity depending whether the upper base substrate is removed or not. Particularly, in a red wavelength, the reflectivity difference is large. When the upper base substrate is maintained, reflectivity is high at a specific wavelength. As a result, reflection of external light may be visible by the observer. According to an embodiment of the present invention, reflectivity is 4% or less in entire wavelengths of the visible light due to removal of the upper base substrate, and, as such, the observer recognizes little or no reflection of external light.

As is apparent from the above description, there are the following advantages according to an embodiment of the present invention.

First, an organic light emitting display device includes a circular polarizing plate. When an unpolarized external light is incident along a certain transmission axis of the circular polarizing plate, the light is left-circularly polarized or right-circularly polarized. Then, the light is reflected to be right-circularly polarized or left-circularly polarized in an opposite direction. Herein, the reflected light is blocked by an absorption axis of the circular polarizing plate to reduce or prevent visibility of external light. Plastic base substrates of the organic emitting panel disposed at below and the touch panel disposed at upper are provided to have flexibility of the device. When the thin transistor array/organic emitting diode array and the touch electrode array are formed, birefringence may occur at the upper plastic base substrate along the optical path. As a result, reflected external light may not be completely blocked by the absorption axis of the circular polarizing plate due to its twisted optical path. According to an embodiment of the present invention, the upper plastic base substrate is removed to expose the thin separation layer and the cover film, or the circular polarizing plate is directly attached to the separation layer. Namely, unintended birefringence and reflection caused by an upper plastic and/or glass base substrate in the device may be reduced or prevented, and luminousness may be improved due to reduced visibility of reflected external light.

Second, the thick upper plastic base substrate is removed from the organic light emitting diode array, and flexibility and sliminess of the flexible display device can thus be improved.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. Display device comprising:
   a light emitting device in an active region of a substrate;
   an encapsulation on the light emitting device;
   a touch sensor on the encapsulation;
   a touch pad connected to the touch sensor in a pad part of the substrate;
   a routing structure connected to the touch sensor; and
   at least one seal material between the active region and the pad part,
   wherein the touch sensor includes a plurality of a first and a second touch electrodes which cross each other in the active region, at least one bridge pattern electrically connected to the first touch electrodes and a protective layer between the first and second touch electrodes and the bride pattern,
   wherein the first and second touch electrodes include metal mesh patterns, respectively, and
   wherein the at least one seal material is in contact with at least one insulating layer on the substrate, in a peripheral region at an outside region of the active region.

2. The display device according to claim 1, further comprising:
   a first adhesive between the encapsulation and the touch sensor.

3. The display device according to claim 1, further comprising:
   a touch insulating layer between the light emitting device and the routing structure, and overlapping at least a part of the at least one seal material.

4. The display device according to claim 1, further comprising:
   a conductive layer between adjacent seal materials.

5. The display device according to claim 1,
   wherein the substrate is a plastic substrate.

6. The display device according to claim 1, wherein the protective layer covers the first and second touch electrodes.

7. The display device according to claim 6,
   wherein the touch pad includes a plurality of touch pad electrodes corresponding to the first and second touch electrodes in the peripheral region, and
   wherein the routing structure includes a plurality of routing lines transferring signals from the touch pad electrodes to the first and second touch electrodes, respectively.

8. The display device according to claim 7,
wherein the first and second touch electrodes are disposed on different levels from the touch pad electrodes and the routing lines.

9. The display device according to claim 7,
wherein the touch sensor further comprises a barrier layer and an organic buffer layer contacting each other, each of the barrier layer and the organic buffer layer has an active region and a peripheral region.

10. The display device according to claim 9,
wherein the first and second touch electrodes are in contact with an external light shielding pattern including a color filer layer and a black matrix layer in the active region, and the touch pad electrodes and the routing lines are in contact with the barrier layer in the peripheral region.

11. The display device according to claim 9,
wherein the at least one seal material in contact with the barrier layer and the touch pad electrodes.

12. The display device according to claim 7,
wherein each of the first and second touch electrodes, the routing lines, and the touch pad electrodes has at least double-layered electrode structure.

13. The display device according to claim 12,
wherein the at least double-layered electrode structure includes a metal pattern and a transparent electrode on the metal pattern having a larger area than the metal pattern.

14. The display device according to claim 12, wherein the bridge pattern is disposed through a contact hole in the protective layer at each crossing part between the first and second touch electrodes, to connect adjacent first touch electrodes.

15. The display device according to claim 14,
wherein the first and the second touch electrodes are disposed at the same level except each crossing part.

16. The display device according to claim 1, further comprising:
a second adhesive on the touch sensor and a polarizing plate on the second adhesive.

17. The display device according to claim 16,
wherein the seal material overlaps with the second adhesive and the polarizing plate.

18. The display device according to claim 17, further comprising a cover film to protect an outside surface of the display device.

19. The display device according to claim 1, wherein the at least one insulating layer on the substrate is extended to an edge of the substrate to cover a touch auxiliary electrode.

20. The display device according to claim 19, further comprising: a conductive layer between adjacent seal materials,
wherein the conductive layer is in contact with opposing surfaces of the touch pad and the touch auxiliary electrode.

21. The display device according to claim 4, wherein the conductive layer between adjacent seal materials is electrically connected to the touch pad.

22. The display device according to claim 1, wherein the contact hole overlaps with a part of a bank defining a light emitting region.

23. Display device comprising:
a light emitting device in an active region of a substrate;
an encapsulation on the light emitting device;
a touch sensor on the encapsulation;
a touch pad connected to the touch sensor in a pad part of the substrate;
a routing line connected to the touch sensor; and
at least one seal material between the active region and the pad part,
wherein the touch sensor includes a plurality of a first and a second touch electrodes which cross each other in the active region, at least one bridge pattern electrically connected to the first touch electrodes and a protective layer between the first and second touch electrodes and the bride pattern,
wherein the first and second touch electrodes include metal mesh patterns, respectively, and
wherein the encapsulation is in contact with at least one insulating layer on the substrate, in a peripheral region.

24. The display device according to claim 23, further comprising:
a first adhesive between the encapsulation and the touch sensor.

25. The display device according to claim 23, further comprising:
a touch insulating layer between the light emitting device and the routing line, and overlapping at least a part of the at least one seal material.

26. The display device according to claim 23, further comprising:
a conductive layer electrically connected to the touch pad between adjacent seal material.

27. The display device according to claim 23,
wherein the substrate is a plastic substrate.

28. The display device according to claim 23, wherein the protective layer covers the first and second touch electrodes.

29. The display device according to claim 28,
wherein the touch pad includes a plurality of touch pad electrodes corresponding to the first and second touch electrodes in the peripheral region, and
wherein the routing structure includes a plurality of routing lines transferring signals from the touch pad electrodes to the first and second touch electrodes, respectively.

30. The display device according to claim 29,
wherein the first and second touch electrodes are disposed on different levels from the touch pad electrodes and the routing lines.

31. The display device according to claim 29,
wherein the touch sensor further comprises a barrier layer and an organic buffer layer contacting each other, each of the barrier layer and the organic buffer layer has an active region and a peripheral region.

32. The display device according to claim 31,
wherein the first and second touch electrodes are in contact with an external light shielding pattern including a color filer layer and a black matrix layer in the active region, and the touch pad electrodes and the routing lines are in contact with the barrier layer in the peripheral region.

33. The display device according to claim 31,
wherein the at least one seal material in contact with the barrier layer and the touch pad electrodes.

34. The display device according to claim 29,
wherein each of the first and second touch electrodes, the routing lines, and the touch pad electrodes has at least a double-layered electrode structure.

35. The display device according to claim 34,
wherein the at least double-layered electrode structure includes a metal pattern and a transparent electrode on the metal pattern having a larger area than the metal pattern.

36. The display device according to claim 34, wherein the bridge pattern is disposed through a contact hole in the protective layer at each crossing part between the first and second touch electrodes, to connect adjacent first touch electrodes.

37. The display device according to claim 36, wherein the first and the second touch electrodes are disposed at the same level except each crossing part.

38. The display device according to claim 23, further comprising:
a second adhesive on the touch sensor and a polarizing plate on the second adhesive.

39. The display device according to claim 38, wherein the at least one seal material overlaps with the second adhesive and the polarizing plate.

40. The display device according to claim 39, further comprising a cover film to protect an outside surface of the display device.

41. An organic light emitting display device comprising:
a substrate;
a thin film transistor array including an active layer, a gate electrode, a source and drain electrode on the substrate;
at least one light emitting device on the thin film transistor array;
an encapsulation layer on the at least one light emitting device;
a dielectric interlayer between the substrate and the encapsulation layer;
a touch electrode array on the encapsulation layer, the touch electrode array having a plurality of first touch electrodes and second touch electrodes intersecting each other and at least one bridge pattern electrically connected to the first touch electrodes through a contact hole in a protective layer;
a touch pad electrode electrically connected to the touch electrode array; and
a routing line electrically connected to the touch pad electrode and in contact with the dielectric interlayer,
wherein the first and second touch electrodes include metal mesh patterns, respectively.

* * * * *